United States Patent
Otsuka et al.

(10) Patent No.: US 9,108,228 B2
(45) Date of Patent: Aug. 18, 2015

(54) LIQUID PROCESSING APPARATUS HAVING SWITCHABLE NOZZLES

(71) Applicant: Tokyo Electron Limited, Tokyo (JP)

(72) Inventors: Takahisa Otsuka, Kumamoto (JP); Hirotaka Maruyama, Kumamoto (JP); Nobuhiro Ogata, Kumamoto (JP); Kazuyuki Kudo, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 113 days.

(21) Appl. No.: 13/779,969

(22) Filed: Feb. 28, 2013

(65) Prior Publication Data
US 2013/0228200 A1 Sep. 5, 2013

(30) Foreign Application Priority Data
Mar. 5, 2012 (JP) ................................. 2012-048127

(51) Int. Cl.
*H01L 21/00* (2006.01)
*B08B 3/04* (2006.01)
*H01L 21/67* (2006.01)

(52) U.S. Cl.
CPC .............. *B08B 3/04* (2013.01); *H01L 21/6708* (2013.01); *H01L 21/6715* (2013.01); *H01L 21/67051* (2013.01)

(58) Field of Classification Search
CPC ................... H01L 21/67051; H01L 21/67028; H01L 21/6704; H01L 21/02052; H01L 21/6708
USPC ........................ 134/26, 18, 94.1, 56 R, 27, 28
See application file for complete search history.

(56) References Cited

U.S. PATENT DOCUMENTS

| 2004/0087158 A1 * | 5/2004 | Izumi et al. ................... 438/689 |
| 2006/0040051 A1 * | 2/2006 | Yamamoto et al. ........... 427/240 |

FOREIGN PATENT DOCUMENTS

| JP | 2006086415 A * | 3/2006 | ................ B08B 3/02 |
| JP | 2009-059895 A | 3/2009 | |
| JP | 2009-141279 A | 6/2009 | |
| JP | 2010-056318 A | 3/2010 | |

OTHER PUBLICATIONS

English Machine Translation of Description of JP2006086415 (Tokuri, 2006).*

* cited by examiner

*Primary Examiner* — Michael Barr
*Assistant Examiner* — Irina Graf
(74) *Attorney, Agent, or Firm* — Abelman, Frayne & Schwab

(57) ABSTRACT

Provided is a liquid processing apparatus that selectively supplies processing liquids with a switching operation to the surface of a substrate to perform a liquid processing. The liquid processing apparatus includes a first processing liquid supply unit including a first nozzle block that selectively supplies an acidic chemical liquid and a rinse liquid, and a second processing liquid supply unit including a second nozzle block that selectively supplies an alkaline chemical liquid and a rinse liquid. When a chemical liquid is supplied to the substrate from one of the first and second nozzle blocks, the other of the first and second nozzle blocks is retreated to a retreat position. When the rinse liquid is supplied to the substrate from one of the first and second nozzle blocks, the other of the first and second nozzle blocks is moved to a processing position.

15 Claims, 10 Drawing Sheets

LIQUID PROCESSING APPARATUS HAVING SWITCHABLE NOZZLES

CROSS-REFERENCE TO RELATED APPLICATIONS

This application is based on and claims priority from Japanese Patent Application No. 2012-048127, filed on Mar. 5, 2012, with the Japanese Patent Office, the disclosure of which is incorporated herein in its entirety by reference.

TECHNICAL FIELD

The present disclosure relates to a technology that switchingly supplies an acidic chemical liquid and an alkaline chemical liquid on a surface of a substrate so as to perform a liquid processing of the substrate.

BACKGROUND

In a semiconductor device fabrication process that forms a stacked structure of an integrated circuit on a surface of a substrate, such as for example, a semiconductor wafer ("wafer"), there is known a single wafer type liquid processing apparatus that supplies an alkaline chemical liquid or an acidic chemical liquid to the surface of a rotating wafer so as to remove, for example, dusts or a natural oxide.

Japanese Patent Laid-Open Publication No. 2009-59895 discloses a liquid processing apparatus of the above-described type that selectively supplies an acidic chemical liquid and an alkaline chemical liquid using a switching operation of a common nozzle or a plurality of nozzles installed in a common nozzle block. See, e.g., paragraphs [0044] to [0047] and [0063] to [0069] and FIGS. 2 and 3 of Japanese Patent Laid-Open Publication No. 2009-59895. However, when the acidic chemical liquid and the alkaline chemical liquid are supplied through the common nozzle or the nozzles installed in the common nozzle block, vapors or mists of the chemical liquids may be adhered to the outer surface of the nozzle(s), the nozzle block, a nozzle arm, or the like, thereby producing salts on these portions and causing a cross-contamination which may be the source of a particle generation.

SUMMARY

According to a first aspect of the present disclosure, there is provided a liquid processing apparatus comprising: a first processing liquid supply unit including a first nozzle block provided with a nozzle configured to selectively supply an acidic chemical liquid and a rinse liquid with a switching operation to a substrate horizontally held and being rotated, and a first moving mechanism configured to move the first nozzle block between a processing position above the substrate and a retreat position next to the substrate; a second processing liquid supply unit including a second nozzle block provided with a nozzle configured to selectively supply an alkaline chemical liquid and the rinse liquid with a switching operation to the substrate, and a second moving mechanism configured to move the second nozzle block between a processing position above the substrate and a retreat position next to the substrate; and a control unit configured to output a control signal to set one of the first nozzle block and the second nozzle block to a retreat position when a chemical liquid is supplied to the substrate from the other of the first nozzle block and the second nozzle block, and to move the other of the first nozzle block and the second nozzle block to a processing position when one of the first nozzle block and the second nozzle block is supplying the rinsing liquid to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
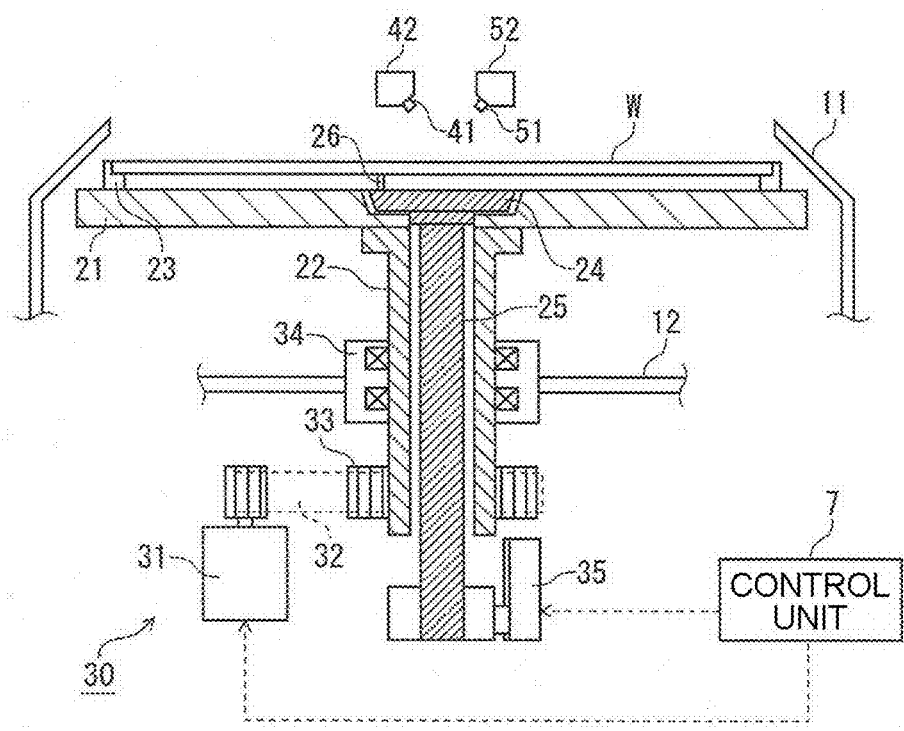
FIG. 1 is a longitudinal cross-sectional view of a liquid processing apparatus according to an exemplary embodiment.

In the following detailed description, references are made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in consideration of the problems occurring in the related art, and an aspect of the present disclosure is to provide a liquid processing apparatus and a liquid processing method capable of reducing particles produced in an apparatus that switchingly supplies an acidic chemical liquid and an alkaline chemical liquid. The present disclosure also provides a computer-readable storage device that stores the method.

According to a first aspect of the present disclosure, there is provided a liquid processing apparatus comprising: a first processing liquid supply unit including a first nozzle block provided with a nozzle configured to selectively supply an acidic chemical liquid and a rinse liquid with a switching operation to a substrate horizontally held and being rotated, and a first moving mechanism configured to move the first nozzle block between a processing position above the substrate and a retreat position next to the substrate; a second processing liquid supply unit including a second nozzle block provided with a nozzle configured to selectively supply an alkaline chemical liquid and the rinse liquid with a switching operation to the substrate, and a second moving mechanism configured to move the second nozzle block between a processing position above the substrate and a retreat position next to the substrate; and a control unit configured to output a control signal to set one of the first nozzle block and the second nozzle block to a retreat position when a chemical liquid is supplied to the substrate from the other of the first nozzle block and the second nozzle block, and to move the other of the first nozzle block and the second nozzle block to a processing position when one of the first nozzle block and the second nozzle block is supplying the rinsing liquid to the substrate.

The liquid processing apparatus as described above may include any of features set forth below.

(a) The control unit may output a control signal to initiate supplying of the rinse liquid from the other of the first nozzle block and the second nozzle block at the processing position when the rinse liquid is supplied from one of the first nozzle block and the second nozzle block.

(b) The control unit may output a control signal to to initiate retreating of one of the first nozzle block and the second nozzle block when the other of the first nozzle block and the second nozzle block is supplying the rinse liquid to the substrate.

(c) The control unit may output a control signal to initiate supplying of the chemical liquids from the other of the first nozzle block and the second nozzle block at the processing position before the surface of the substrate is exposed from the rinse liquid level after supplying of the rinse liquid is stopped from one of the first nozzle block and the second nozzle block.

(d) The control unit may output a control signal to stop the supply of the rinse liquid from one of the first nozzle block and the second nozzle block after both of the one and the other of the first nozzle block and the second nozzle block concurrently supply the rinse liquid.

(e) An ejecting direction of each of the first nozzle block and the second nozzle block may be set in such a manner that the rinse liquid supplied from the first nozzle block and the rinse liquid supplied from the second nozzle block arrive at the same position on the surface of the substrate.

(f) The first nozzle block or the second nozzle block may have a common nozzle configured to supply a chemical liquid and a rinse liquid. In addition, the first nozzle block may be provided with a nozzle configured to supply a drying liquid that is supplied to the substrate when the rinse liquid is dried.

According to a second aspect of the present disclosure, there is provided a liquid processing method comprising: setting one of a first nozzle block and a second nozzle block to a processing position above a substrate horizontally held and being rotated to supply a chemical liquid, the first nozzle block including a nozzle configured to supply an acidic chemical liquid and a rinse liquid and the second nozzle block including a nozzle configured to supply an alkaline chemical liquid and a rinse liquid; switching the chemical liquid supplied from one of the first nozzle block and the second nozzle block to a rinse liquid; moving the other of the first nozzle block and the second nozzle block from a retreating position next to the substrate to a processing position above the substrate while one of the first nozzle block and the second nozzle block is supplying the rinse liquid; after moving the other of the first nozzle block and the second nozzle block to the processing position above the substrate, initiating moving one of the first nozzle block and the second nozzle block from the processing position above the substrate to the retreating position next to the substrate; and after one of the first nozzle block and the second nozzle block is retreated from the upper side of the substrate, supplying the chemical liquid from the other of the first nozzle block and the second nozzle block, thereby selectively supplying an acidic chemical liquid, an alkaline chemical liquid and the rinse liquid with a switching operation.

The liquid processing method further includes: when the rinse liquid is supplied from the one nozzle block, supplying the rinse liquid from the other nozzle block at the processing position.

The liquid processing method further includes: when the rinse liquid is supplied to the substrate from the other of the first nozzle block and the second nozzle block, initiating retreating one of the first nozzle block and the second nozzle block to the retreat position.

The liquid processing method further includes: after supplying of the rinse liquid from one of the first nozzle block and the second nozzle block is stopped, initiating supplying the chemical liquid from the other of the first nozzle block and the second nozzle block to the substrate at the processing position before the surface of the substrate is exposed from the rinse liquid level.

The liquid processing method further includes: after both of the first nozzle block and the second nozzle block concurrently supply the rinse liquid, stopping supplying of the rinse liquid from one of the first nozzle block and the second nozzle block.

The liquid processing method further includes: supplying the rinse liquid supplied from the first nozzle block and the rinse liquid supplied from the second nozzle block to the same position on the surface of the substrate.

According to a third aspect of the present disclosure, there is provided a non-transitory computer-readable storage medium having stored therein a computer-readable program used in a liquid processing apparatus that selectively supplies an acidic chemical liquid, an alkaline chemical liquid, and a rinse liquid with a switching operation to a horizontally held and rotated substrate, wherein the program is programmed steps to execute the liquid processing method of claim 9.

According to the present disclosure, in switchingly supplying an acidic chemical liquid and an alkaline chemical liquid using a first nozzle that supplies the acidic chemical liquid and a second nozzle that supplies the alkaline chemical liquid to a surface of a rotated substrate, when one nozzle (or the other nozzle) supplies a chemical liquid at a processing position, the other nozzle (or the one nozzle) is retreated to the outside of the substrate. In addition, when the switching of the chemical liquids, if the processing liquid supplied from the one nozzle among the two nozzles is switched from a chemical liquid to the rinse liquid, the remaining other nozzle is positioned above the substrate. Accordingly, the vapors or mists of the acidic chemical liquid and the alkaline chemical liquid are not easily adhered to each of the nozzles and the moving mechanisms thereof, thereby suppressing the occurrence of a cross-contamination.

The configuration of a liquid processing apparatus according to an exemplary embodiment of the present disclosure will be described with reference to FIGS. 1 to 3. As illustrated in FIG. 1, the liquid processing apparatus includes a disc-shaped support plate 21 provided with a plurality of support pins 23, for example, three support pins 23 that horizontally support a wafer W, and a rotation shaft 22 that is connected to the bottom surface of support plate 21 and extends in the vertical direction.

A pulley 33 is installed in the lower end side of rotation shaft 22, and a rotary motor 31 is arranged next to pulley 33. A driving belt 32 is wound over pulley 33 and a rotation shaft of rotary motor 31, thereby forming a rotational driving mechanism 30 that rotates wafer W on support plate 21 about a vertical axis. In addition, rotation shaft 22 is fixed to a bed plate 12 of a case through a bearing 34, in which the liquid processing apparatus is arranged in the case.

Support plate 21 is cut out in a circular shape at the central area thereof, and a disc-shaped elevation plate 24 is disposed in the cut-out portion. A plurality of lift pins 26, for example, three lift pins 26 are disposed on the top surface of elevation plate 24 to support wafer W in the rear (bottom) side of wafer W when wafer W is transferred between elevation plate 24 and an external wafer transportation mechanism.

A lift shaft 25 extends vertically through the inside of rotation shaft 22 and is connected to the bottom surface of elevation plate 24. An elevation mechanism 35 is installed at the lower end of lift shaft 25 to lift or lower lift shaft 25. In addition, in the outside of support plate 21, a cup 11 is installed to cover wafer W supported by support pins 23 from the peripheral edge and inclined upper side of cup 11.

The liquid processing apparatus configured as described above uses a diluted hydrofluoric acid ("DHF") as the acidic chemical liquid for removing a natural oxide from the surface of wafer W. In addition, an aqueous solution of a mixture of ammonia and hydrogen peroxide ("SC-1") is used as the alkaline chemical liquid for removing an organic contaminant or particles adhered to the surface of wafer W. As described in the background of art, the acidic chemical liquid and the alkaline chemical liquid are adapted to be supplied to the surface (top surface) of wafer W using dedicated nozzles 41, 51, respectively. Hereinbelow, descriptions will be made as to the configuration of a processing liquid supply unit that includes nozzles 41, 51.

Figure 2:
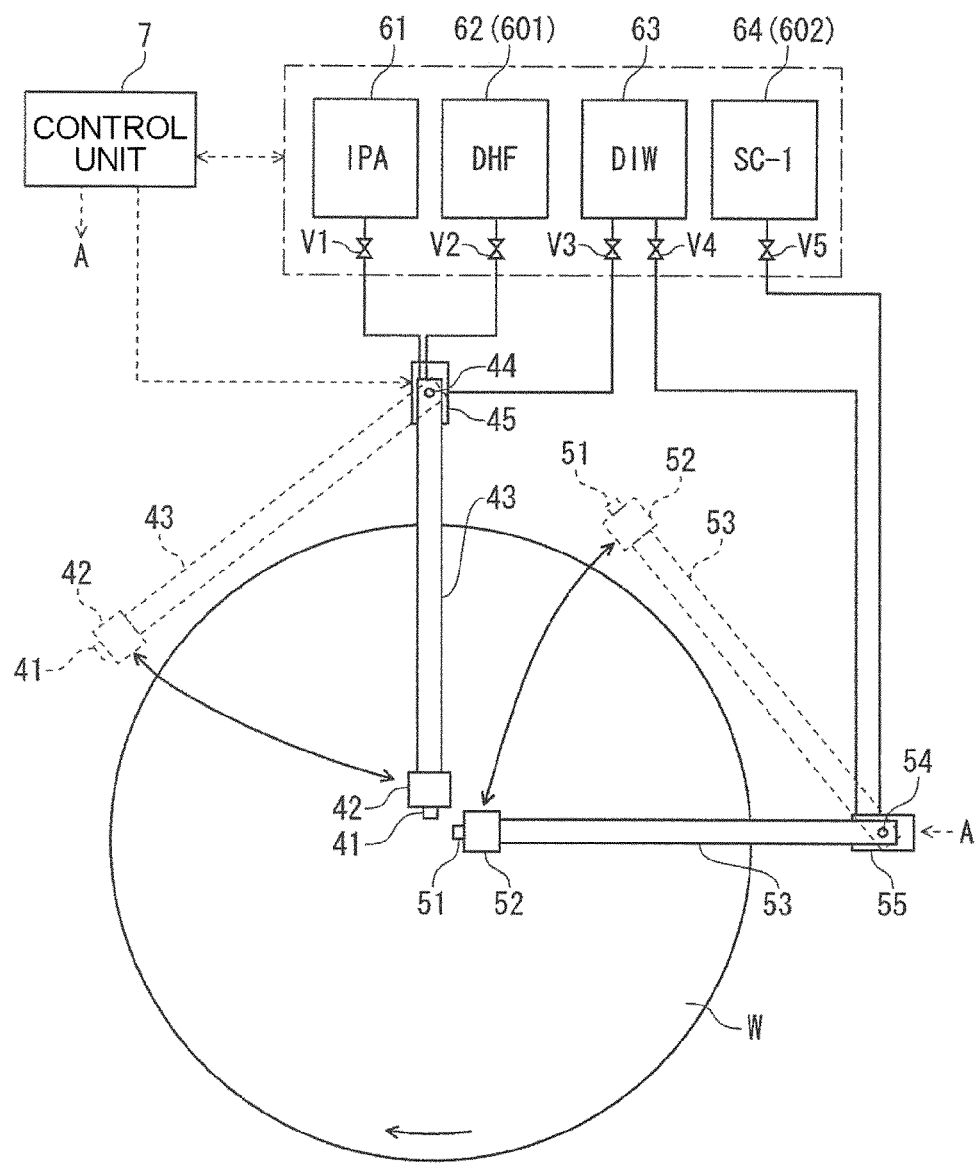
FIG. 2 is a plan view illustrating the configuration of the processing liquid supply unit installed in the liquid processing apparatus.
Figure 3:
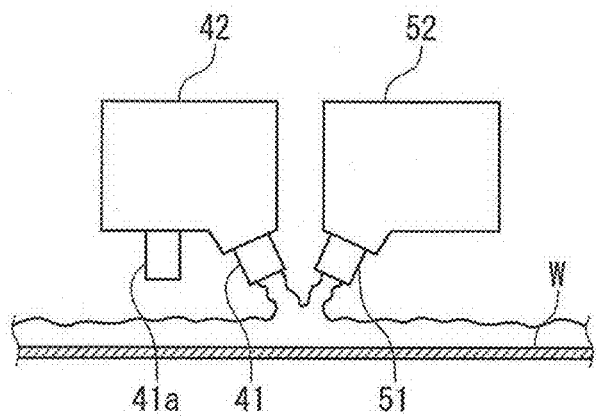
FIG. 3 is an enlarged side view of the first and second nozzles installed in the processing liquid supply unit.

First nozzle 41 illustrated in FIGS. 1 to 3 serves to supply DHF and deionized water ("DIW") to the surface of wafer W. First nozzle 41 is installed on the bottom side of a nozzle block 42, and nozzle block 42 is attached to a tip end of a cantilever type nozzle arm 43.

Figure 5:
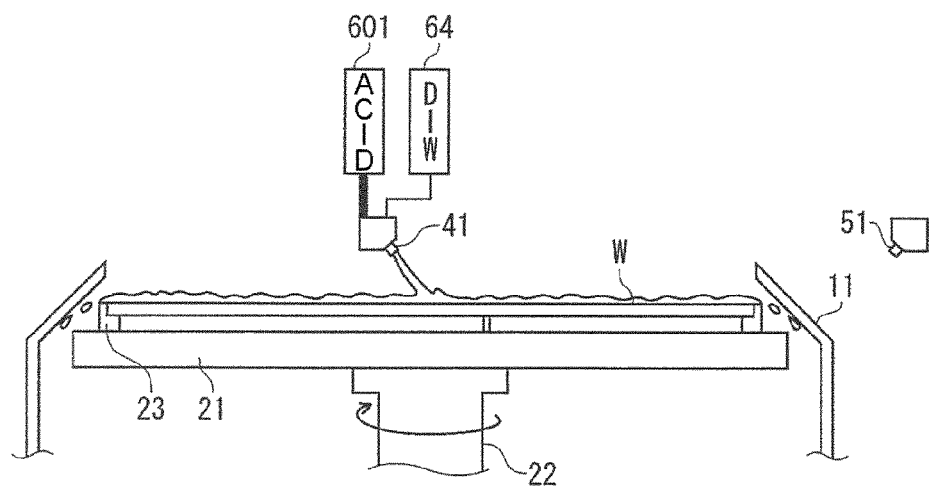
FIG. 5 is a first explanatory view illustrating an action of the liquid processing apparatus.

A base end of nozzle arm 43 is attached to a driving unit 45 through a rotation shaft 44. As driving unit 45 moves nozzle arm 43 left and right, first nozzle 41 may be moved between a processing position (depicted by solid lines in FIG. 2) above the center of the rotation of wafer W (the central portion of wafer), and a retreat position (depicted by dotted lines in FIG. 2) retreated next to wafer W from the upper side of wafer W. Although not illustrate in FIG. 2 for convenience, the retreat position of first nozzle 41 is set to be positioned outside cup 11, for example, as illustrated in FIG. 5.

In the inside of nozzle arm 43 and first nozzle 41, liquid flow paths are formed which are not illustrated, and a DHF unit 62 and a DIW supply unit 63 are connected to the liquid flow paths. DHF unit 62 and DIW supply unit 63 include tanks for various processing liquids (a chemical liquid and DIW), a pump, and a flow control mechanism. By opening or closing opening/closing valves V2, V3 installed in the connection lines that connect the liquid flow paths and supply units 62, 63 of respective processing liquids, DHF and DIW may be selectively supplied with a switching operation to wafer W from first nozzle 41.

Here, nozzle block 42 including first nozzle 41 corresponds to a first nozzle block of the exemplary embodiment. Also, nozzle arm 43 that supports nozzle block 42 and rotation shaft 44 that moves nozzle arm 43, and driving unit 45 correspond to a first moving mechanism that moves nozzle block 42. In addition, a first processing liquid supply unit of the present exemplary embodiment is configured by a first nozzle block including first nozzle 41 (nozzle block 42) and the first moving mechanism. Here, the "nozzle block" in the present disclosure may include a function of retaining the nozzle on wafer W, and its shape is not limited to a specific one. For example, an opening may be formed at the tip end of nozzle arm 43 so as to insert first nozzle 41 into the opening to be retained. In such a case, the tip end of nozzle arm 43 corresponds to the nozzle block.

In addition, as illustrated in FIG. 3, nozzle block 42 is equipped with an IPA nozzle 41a to supply an isopropyl alcohol (IPA) that is a dry liquid used when spin-drying wafer W. The IPA supplied from IPA supply unit 61 is supplied to IPA nozzle 41a through a fluid path that is different from that of the acidic chemical liquid or DIW. IPA nozzle 41a of nozzle block 42 is omitted in the drawings except for FIG. 3. Also, the position to install IPA nozzle 41a is not limited to nozzle block 42. As described below, IPA nozzle 41a may be installed at a nozzle block 52 in a second nozzle 51 side to be described later, or a nozzle block or a moving mechanism only for IPA nozzle 41a may be provided.

Next, second nozzle 51 serves to supply an alkaline chemical liquid (SC-1) and DIW to the surface of wafer W. Second nozzle 51 installed on the bottom side of nozzle block 52 is connected to a driving unit 55 through a nozzle arm 53 and a rotation shaft 54. Like first nozzle 41, second nozzle 51 may be moved between a processing position (depicted by solid lines in FIG. 2) above the rotation center of wafer W (the central portion of wafer W), and a retreat position (depicted by dotted lines in FIG. 2) retreated next to wafer W from the upper side of wafer W.

DIW supply unit 63 and SC-1 supply unit 64, nozzle block 52 are connected to second nozzle 51 through a liquid flow path formed in nozzle arm 53 and connection pipe lines installed with opening/closing valves V4, V5. The supply of SC-1 and DIW from second nozzle 51 to wafer W may be performed selectively through a switching operation.

Also, nozzle block 52 provided with second nozzle 51 corresponds to the second nozzle block of the present exemplary embodiment. In addition, nozzle arm 53 that supports nozzle block 52, and rotation shaft 54 and driving unit 55 that move nozzle arm 43 correspond to the second moving mechanism that moves nozzle block 52. In addition, the second processing liquid supply unit of the present exemplar embodiment is configured by the second nozzle block including second nozzle 51 (nozzle block 52), and the second moving mechanism.

Each of first nozzle 41 and second nozzle 51 described above has an ejection direction of a processing liquid that is set to supply the processing liquid from an inclined upper side toward horizontally held wafer W as illustrated in FIG. 3. The inclined angles of nozzles 41, 51 are set in such a manner that when the DIWs are ejected from both nozzles 41, 51 which are in the processing positions, the DIWs arrive at the same position on the surface of wafer W. In other words, the DIWs supplied two different nozzles 41, 51 are concentrated to a substantially single point on the surface of wafer W (which is set to the center of rotation (central area) of wafer W in the present exemplary embodiment). The reason why the ejecting directions of the processing liquids from both nozzles 41, 51 are set in this manner will be described in detail when describing the functional actions below.

The liquid processing apparatus as described above is connected to a control unit 7 as illustrated in FIGS. 1 and 2. Control unit 7 is configured, for example, by a computer that is provided with a CPU and a memory unit which are not illustrated. The memory may store a program in which a group of control steps (commands) of the liquid processing apparatus are programmed including rotating wafer W supported on support plate 21, selectively supplying processing liquids based on a preset schedule while moving first nozzle 41 and second nozzle 51 between the retreat position and the processing position, and after the liquid processing is performed, drying and taking out wafer W The program may be stored in a storage medium, such as for example, a hard disc, a compact disc, a magnet optical disc, or a memory card, and installed to the computer from the storage medium.

Here, in the liquid processing apparatus of the present exemplary embodiment, nozzle 41 that supplies an acidic chemical liquid and nozzle 51 that supplies an alkaline chemical liquid are installed separately from each other. Therefore, during the period where a chemical liquid is supplied from nozzle 41, nozzle 51 may be retreated to the retreat position, and during the period where a chemical liquid is supplied from nozzle 51, nozzle 41 may be retreated to the retreat position.

By performing these operations, nozzles 41, 51, nozzle blocks 42, 52, and the moving mechanisms thereof may be suppressed from being exposed to the vapors or mists of both the acid and alkali. Consequently, the cross-contamination that produces particles caused by the reaction of the acid and the alkali may be suppressed.

Figure 4:
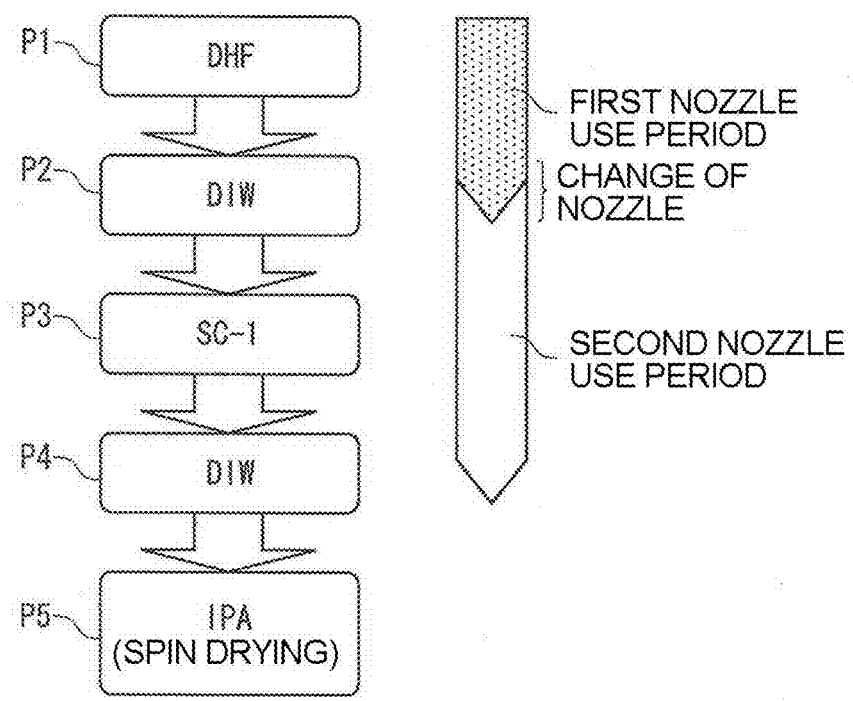
FIG. 4 is an explanatory view illustrating a relationship between chemical liquids supplied from the processing liquid supply unit and the nozzles to be used.

Therefore, control unit 7 of the present exemplary embodiment outputs a control signal to each unit such that the exchange of nozzles 41, 51 and the switching of the processing liquids supplied to wafer W are performed based on a predetermined sequence while maintaining the wet state of the surface of wafer W. Hereinbelow, the functional actions of the liquid processing apparatus will be described with reference to FIGS. 4 to 11. Here, FIG. 4 schematically illustrates a corresponding relationship between the order of switching the processing liquids supplied to wafer W (a chemical liquid and a DIW) and nozzles 41, 51 used when supplying each of the processing liquids. In addition, in each of FIGS. 5 to 10, DHF supply unit 62 is indicated as an acidic chemical liquid supply unit 601, and SC-1 supply unit 64 is indicated as an alkaline chemical liquid supply unit 602, thereby indicating an overall notation of the chemical liquid supply units.

The liquid processing apparatus is in a stand-by state with a state where two nozzles 41, 51 are retreated to the retreat position, and support plate 21 is stopped. In addition, when an external wafer transportation mechanism introduces a fork, which is holding wafer W, into the upper side of support plate 21, elevation plate 24 is lifted such that the fork and elevation plate 24 are crossed with each other, and wafer W is transferred onto lift pins 26 of elevation plate 24.

Then, after the fork is retreated from the upper side of support plate 21, elevation plate 24 is lowered, and wafer W is disposed on support pins 23 of support plate 21. Subsequently, rotary motor 31 is operated, and wafer W on support plate 21 is rotated, and when wafer W arrives at a predetermined revolution speed , first nozzle 41 is moved from the retreat position to the processing position.

Thereafter, the supply of a DHF (acidic chemical liquid) from DHF supply unit 62 (acidic chemical liquid supply unit 601) is initiated, thereby removing a natural oxide (P1 in FIG. 4, and FIG. 5). In that event, as illustrated in FIG. 5, since second nozzle 51 is retreated to the retreat position, for example, second nozzle 51, nozzle block 52 and nozzle arm 53 do not easily contact with the vapors or mists of the acidic chemical liquid, and the cross-contamination does not occur easily.

Figure 6:
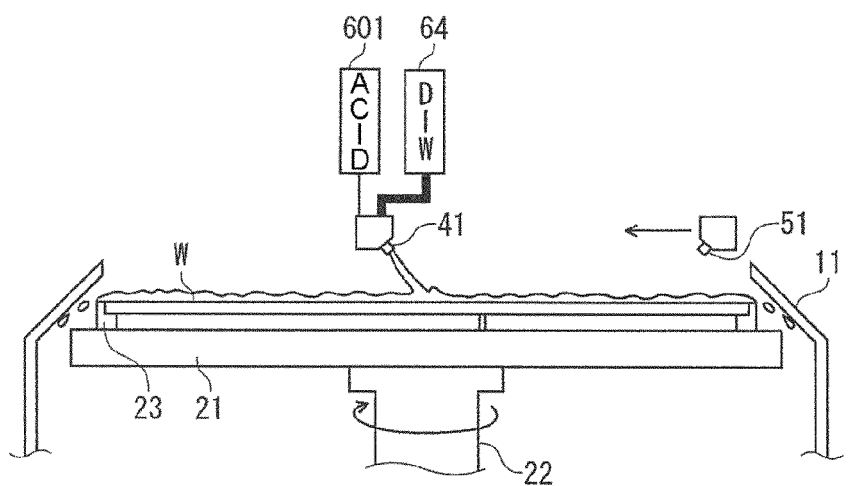
FIG. 6 is a second explanatory view illustrating an action of the liquid processing apparatus.

When the supply of DHF is performed for a predetermined length of time, the processing liquid supplied from first nozzle 41 is switched to DIW, a rinsing is performed for wafer W (P2 in FIG. 4 and FIG. 6). When DIW is supplied, DHF on wafer W is washed out by DIW. In addition, when DIW is supplied from first nozzle 41, the movement of second nozzle 51 from the retreat position toward the processing position is initiated (FIG. 6). In that event, second nozzle 51 placed at the retreat position may be moved to and put on hold at a position prior to the entry of the second nozzle 51 into the upper side of the wafer W between the retreat position and wafer W, while keeping second nozzle 51, nozzle block 52 and nozzle arm 53 at a distance where DHF is not adhered thereto.

As described above, since the movement of second nozzle 51 is initiated at the time when first nozzle 41 is still in the processing position, the time required for exchanging nozzles 41, 51 may be shortened as compared to the case where the movement of second nozzle 51 is not initiated until first nozzle 41 is retreated from the upper side of wafer W or second nozzle 51 is moved after the rinsing is stopped for the purpose of avoiding the cross-contamination.

Figure 7:
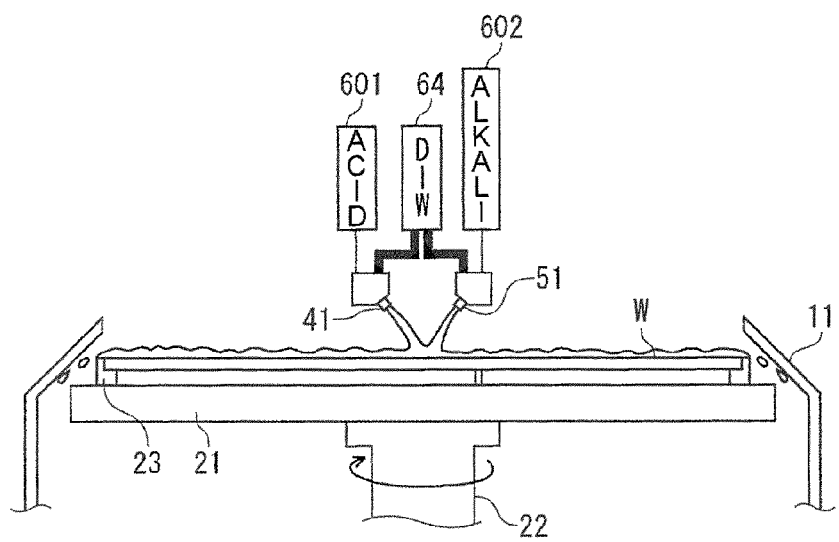
FIG. 7 is a third explanatory view illustrating an action of the liquid processing apparatus.

Thereafter, when second nozzle 51 arrives at the processing position, the supply of DIW to second nozzle 51 is initiated, and DIW is concurrently ejected from first nozzle 41 and second nozzle 51 toward wafer W (P2 in FIG. 4 and FIG. 7). In that event, as described above with reference to FIG. 3, both nozzles 41, 51 are set in terms of the ejecting directions for DIW in such a manner that DIW, which is ejected from nozzles 41, 51, intersect at a position where they arrive at the surface of wafer W, that is, DIW arrives at the same position on wafer W.

Figure 11:
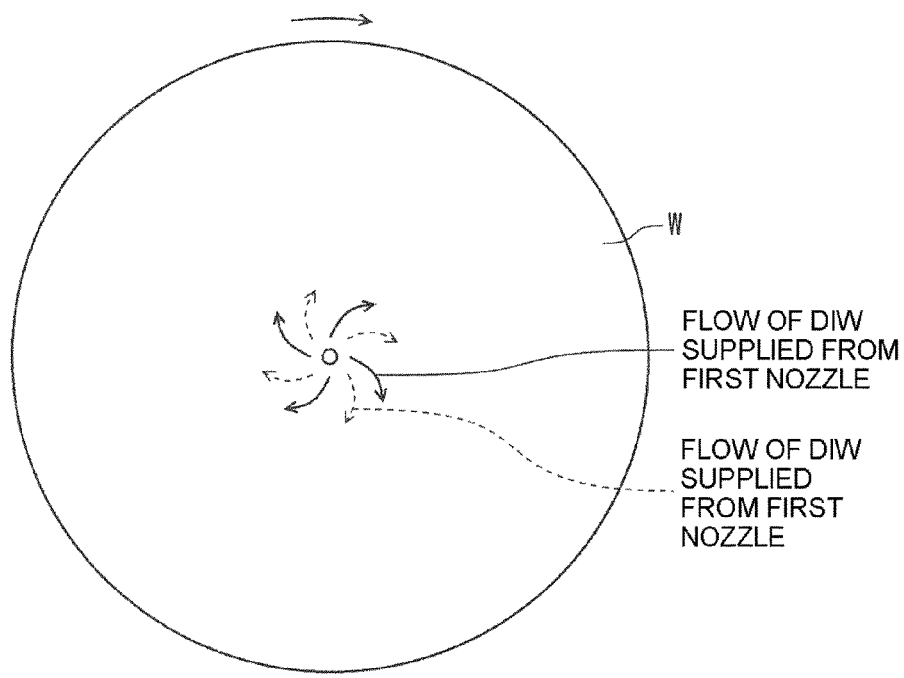
FIG. 11 is a plan view illustrating a state where the DIWs supplied from the first and second nozzles are diffused on the surface of a wafer.

As a result, as illustrated in FIG. 11, the DIW supplied from two different nozzles 41, 51 are concurrently supplied to the rotation center of wafer W, and are uniformly diffused toward the peripheral edge side of wafer W from the center of rotation. If the arriving points of the two fluids are separated from each other, a bubble inclusion phenomenon occurs that produces bubbles B as the DIW entrains a surrounding gas. As indicated in the test results to be described later, the bubble inclusion phenomenon causes particles to remain on the surface of wafer W after a liquid processing. Therefore, the occurrence of particles caused by the production of bubbles B is suppressed by adjusting the ejecting directions of the DIW from the nozzles 41, 51 such that the two fluids interflow to the same position on the surface of wafer W, and minimizing the area of the interflowing region.

Figure 8:
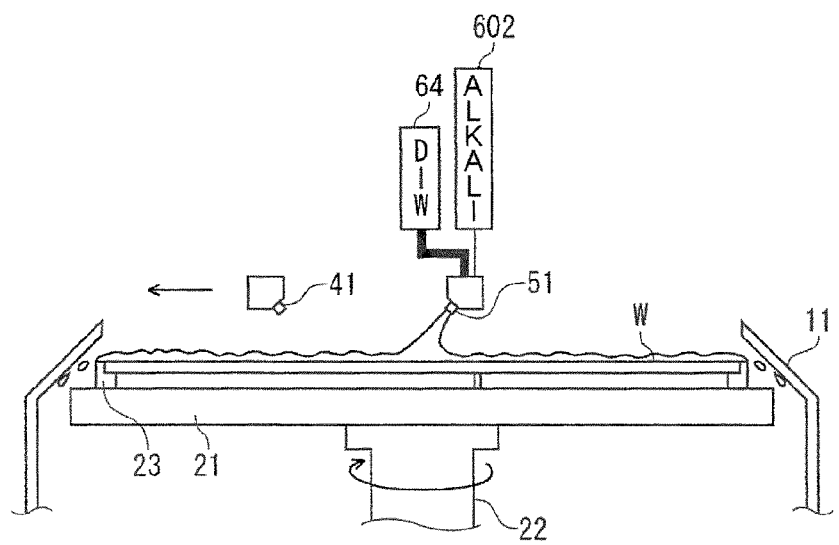
FIG. 8 is a fourth explanatory view illustrating an action of the liquid processing apparatus.

When DIW is concurrently supplied from first nozzle 41 and second nozzle 51, the supply of the DIW from first nozzle 41 is stopped, and first nozzle 41 is retreated from the upper side of wafer W (FIG. 8). As described above, by stopping the supply of DIW from first nozzle 41 and retreating first nozzle 41 from the upper side of wafer W after a timing is secured for concurrently supplying DIW from first nozzle 41 and second nozzle 51, liquids may be continuously supplied to wafer W, thereby suppressing the drying of the surface of wafer W and, hence, the occurrence of watermark.

Figure 9:
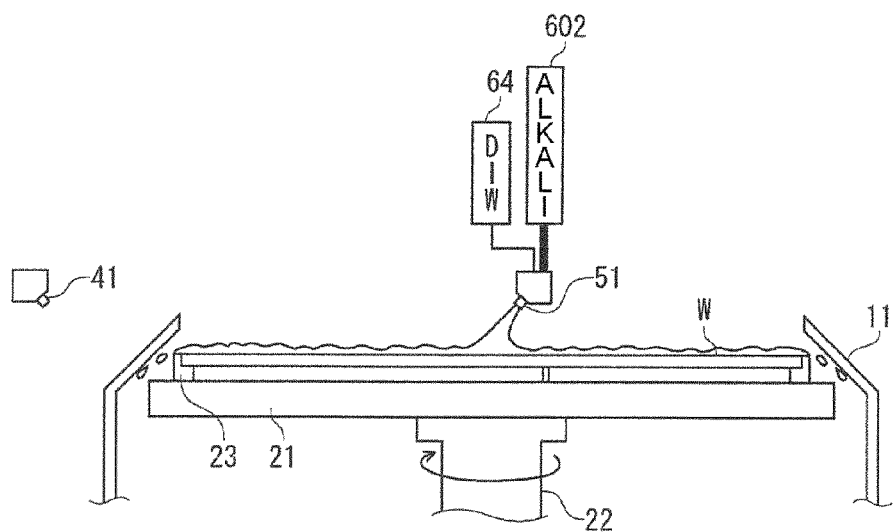
FIG. 9 is a fifth explanatory view illustrating an action of the liquid processing apparatus.

In addition, when first nozzle 41 is at least retreated from the upper side of wafer W, and moved, for example, to the retreat position where it is difficult for SC-1 to be adhered to first nozzle 41, nozzle block 42, and nozzle arm 43, the processing liquid supplied from second nozzle 51 is switched to SC-1 (an alkaline chemical liquid) to remove organic contaminants or particles (P3 in FIG. 4 and FIG. 9).

Figure 10:
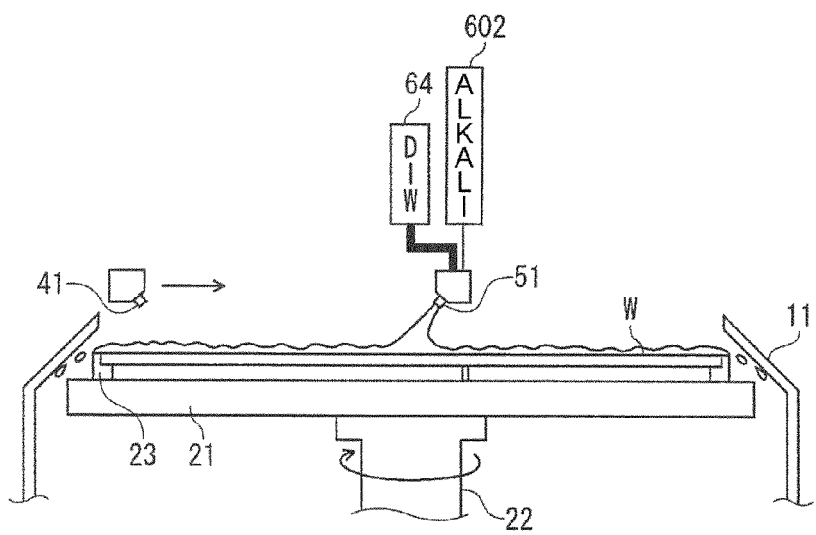
FIG. 10 is a sixth explanatory view illustrating an action of the liquid processing apparatus.

Thereafter, when the supply of SC-1 is performed for a predetermined length of time, the processing liquid supplied from second nozzle 51 is switched again to DIW, and the rinsing of wafer W is performed (P4 in FIG. 4 FIG. 10). When DIW is supplied, and thus SC-1 of wafer W is washed out by DIW such that first nozzle 41, nozzle block 42, and nozzle arm 43 are in the state where it becomes difficult for SC-1 to be adhered thereto, the movement of first nozzle 41 from the retreat position toward first nozzle 41 is initiated (FIG. 10). In that event, the first nozzle 41 at the retreat position may be moved to and put on hold at a position between the retreat position and wafer, and prior to the entry into the upper side of wafer W while maintaining first nozzle 41, nozzle block 42, and nozzle arm 43 at a distance where SC-1 is not adhered thereto.

When the supply of DIW is performed for a predetermined length of time, the supply of DIW from second nozzle 51 is stopped, and IPA is supplied from an IPA nozzle 41a as illustrated in FIG. 3a by a predetermined length of time, while continuously rotating wafer W to perform the spin dry processing of wafer W (P5 in FIG. 4).

When the liquid processing and spin drying of wafer W are completed in this manner, first and second nozzles 41, 51 are retreated to the upper side of the wafer W, and the rotation of wafer W is stopped. Thereafter, elevation plate 24 is raised to lift wafer W and to transfer processing completed wafer W to an external wafer transportation mechanism, and then elevation plate 24 is lowered and waits the carry-in of the next wafer W.

According to the liquid processing apparatus according to the exemplary embodiments, the effects as set forth below may be obtained. In selectively supplying the acidic chemical liquid and the alkaline chemical liquid with a switching operation using first nozzle 41 that supplies the acidic chemical liquid and second nozzle 51 that supplies the alkaline chemical liquid, when first nozzle 41 (or second nozzle 51) supplies the chemical liquid at the processing position, second nozzle 51 (or first nozzle 41) is retreated from the upper side of wafer W. In addition, in a case where the switching of the chemical liquids is performed, when the processing liquid supplied from first nozzle 41 among both nozzles 41, 51 to the central area of wafer W is switched from DHF to DIW, second nozzle 51 is positioned on wafer W. Accordingly, vapors or mists of both of the acidic chemical liquid and the alkaline chemical liquid are not adhered to each of nozzles 41, 51 or the moving mechanism thereof (for example, nozzle blocks 42, 52, and nozzle arms 43, 53), and thus the occurrence of the cross-contamination may be suppressed.

Especially, when the nozzle exchange at the processing position is performed between first nozzle 41 and second nozzle 51, the timing for concurrently supplying DIWs from first nozzle 41 and second nozzle 51 is set such that the nozzle that supplies DIW is switched from one nozzle to the other nozzle among nozzles nozzle 51, 41. Therefore, the liquids are continuously supplied to the surface of wafer W, and thus the occurrence of particles caused by the drying of wafer W and the formation of a watermark may be suppressed.

In addition, the concurrent supply of DIW from first nozzle 41 and second nozzle 51 may not be performed at the time of exchanging the nozzles at the processing position such that a time gap where no DIW is supplied to the central area of wafer W may occur. For example, after the supply of DIW from first nozzle 41 is stopped, and before the surface of wafer W is exposed in a state where the surface of wafer W is not covered by DIW, for example, at the timing where the time gap does not exceed 0.3 seconds, the supply of DIW from second nozzle 51 may be initiated. As a result, the occurrence of particles may be suppressed to such an extent that DIWs are effectively supplied continuously.

Furthermore, with the number of revolutions per minute that does not allow wafer W to be dried, (for example, 1000 rpm or less), the operation of supplying DIW from other nozzle 51 moved to the processing position is also not essential. After DIW is supplied from one nozzle 41, the supply of DIW from nozzle 41 may be stopped without moving other nozzle 51 to the processing position to perform the supply of DIW from other nozzle 51, or nozzle 41 may be retreated from the upper side of wafer W while continuing the supply of DIW and then the supply of the chemical liquid by other nozzle 51 may be initiated.

Figure 12:
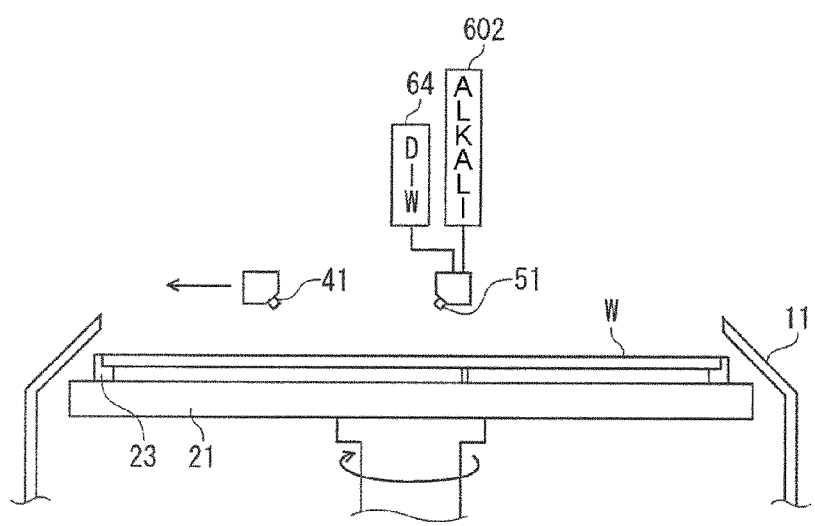
FIG. 12 is an explanatory view illustrating an action of a liquid processing apparatus according to another exemplary embodiment.

Referring to a specific example with the drawings, when the supply of an acidic chemical liquid from first nozzle 41 is terminated, and the supply of DIW from first nozzle 41 is initiated as illustrated in FIG. 6, second nozzle 51 may be moved to the upper side of wafer W. Also, after second nozzle 51 arrives at the processing position, the retreat of first nozzle 41 is initiated without performing the supply of DIW from 51 as illustrated in FIG. 12 (in the example of FIG. 12, the supply of DIW from first nozzle 41 is also stopped). Thereafter, the supply of the alkaline chemical liquid is performed as illustrated in FIG. 9, and the liquid processing of wafer W is resumed.

As described above, at least after DIW is supplied to wafer W, the entry of other nozzle 51, 41 to the upper side of wafer W is allowed. Therefore, the time required for exchanging nozzles 41, 51 may be shortened as compared to, for example, a case where the movement of second nozzle 51 is not initiated until first nozzle 41 is retreated from the upper side of wafer W. In addition, in such a case, first nozzle 41 may initiate the retreating operation directly after the supply of DIW is completed without need to wait the arrival of second nozzle 51 at the processing position such that second nozzle 51 may enter to the upper side of wafer W.

In addition, the kinds of acidic chemical liquid and alkaline chemical liquid used in the liquid processing are not limited to the above-described examples. For example, as for the acidic chemical liquid, SC-2 (an aqueous solution of a mixture of hydrochloric acid and hydrogen peroxide) may be used, and the order of using these chemical liquids may be properly changed based on the contents of a liquid processing to be executed. For example, when SC-1 is supplied from second nozzle 51, first nozzle 41 may be retreated to the retreat position, when DIW is supplied to wafer W from second nozzle 51, first nozzle 41 may be moved to the processing position, and when SC-2 is supplied from first nozzle 41, second nozzle 51 may be retreated to the retreat position. In such a case, second nozzle 51 corresponds to the one nozzle, and first nozzle 41 corresponds to the other nozzle.

[Exemplary Embodiment]

EXPERIMENT 1

A liquid processing was performed while switching the processing liquids supplied to a wafer W in the order of (1) DHF, (2) DIW, (3) SC-1, and (4) DIW, and the number of particles existing on the surface of wafer W and having a diameter of 40 nm or more was measured while changing the switching time between (2) and (3) (a time gap) to 0.3 seconds, 0.7 seconds, 1.2 seconds, 1.5 seconds, 3 seconds, and 5 seconds.

A. Experimental Conditions

Reference Example 1 The number of revolutions per minute of wafer W was set to 300 rpm.

Reference Example 2 The number of revolutions per minute of wafer W was set to 500 rpm.

Reference Example 3 The number revolutions per minute of wafer W was set to 1000 rpm.

B. Experimental Results

Figure 13:
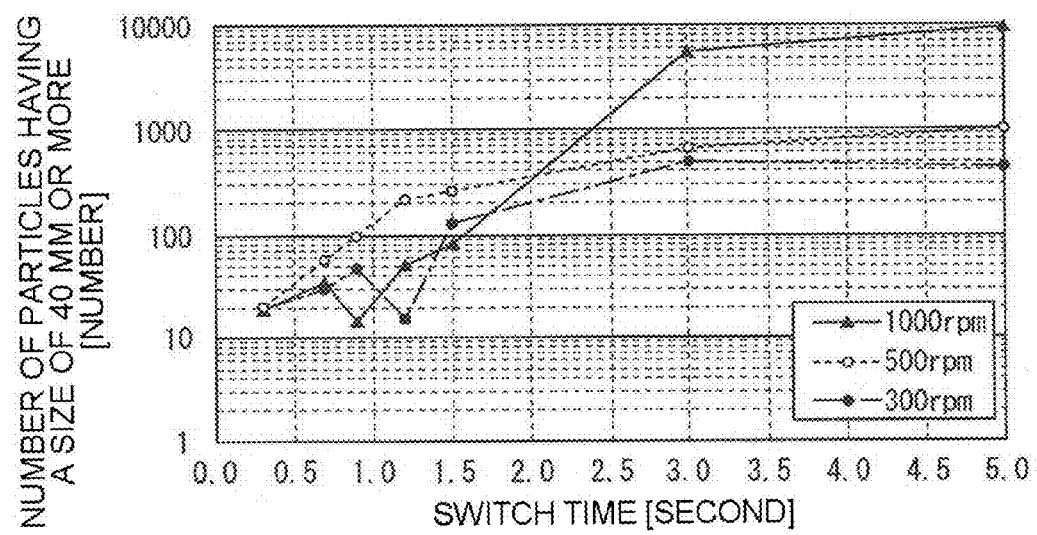
FIG. 13 is an explanatory view illustrating a relationship between an interval of switching the chemical liquids and the number of particles on the surface of a wafer.

FIG. 13 illustrates a graph where the test results of Reference Examples 1 to 3 are plotted. The abscissas of FIG. 13 indicates time for switching, and the ordinate indicates the number of particles on a logarithmic scale. Reference Example 1 is indicated by plotting black circles (●), Reference Example 2 is indicated by plotting white circles (○), and Reference Example 3 is indicated by plotting black triangles (▲).

According to the graph of FIG. 13, it can be seen that although there are some deviations, in all the reference examples, the number of particles increases as the time for switching increases. In addition, it can be seen that in the area exceeding 0.3 seconds, the number of particles increases as the rotation speed of wafer W increases. From these, it is estimated that the influence of occurrence of particles caused by, for example, a watermark on the surface of wafer may increase as the time for switching of processing liquids is lengthened, and the drying speed of wafer W increases.

Meanwhile, for example, when the time for switching is 0.3 seconds, the number of particles is suppressed to about 20 in all the reference examples, which may be evaluated as good as the result in liquid processing. Accordingly, it may be concluded that when the time gap where the processing liquid is not supplied to the central area of a wafer W is within about 0.3 seconds, the occurrence of particles may be suppressed to such an extent that the processing liquid may be considered as being continuously supplied.

EXPERIMENT 2

A. Experimental Conditions

Figure 14:
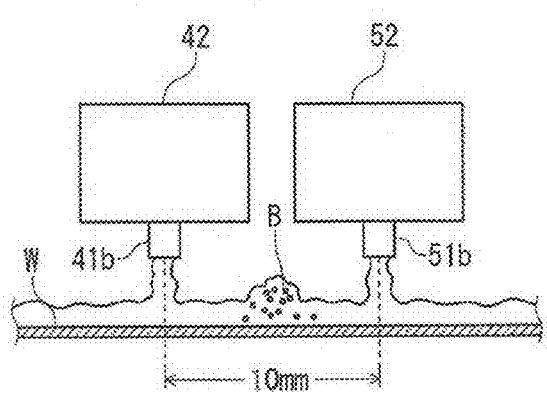
FIG. 14 is an enlarged view of first and second nozzles according to a reference example.

As illustrated in FIG. 14, the particles on the surface of wafer W were observed after a rinsing was performed for changing the ejecting direction from a first nozzle 41b and a second nozzle 51b to a vertically downward direction, and concurrently supplying DIW from nozzles 41b, 51b. The interval between the centers of both nozzles 41b, 51b was 10 mm.

B. Experimental Results

Figure 15:
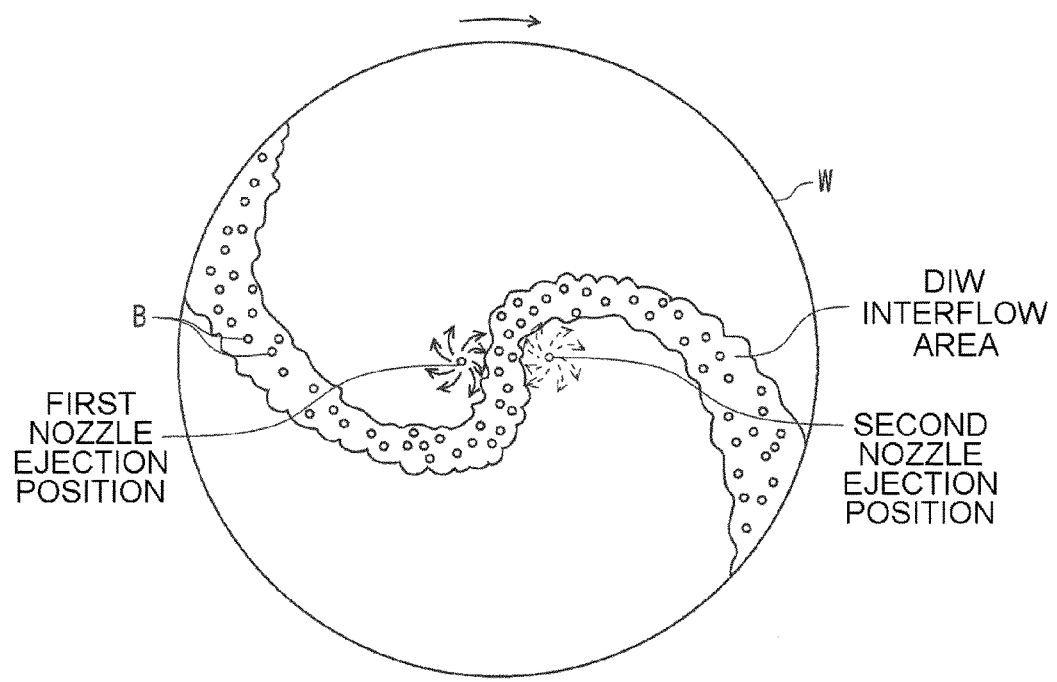
FIG. 15 is a plan view illustrating a state where the DIWs supplied from the first and second nozzles according to the reference example are diffused on the surface of a wafer.

The appearance of the surface of wafer W observed during the period of performing the rinsing is illustrated in FIG. 15. When DIW was supplied to different positions from nozzles 41a, 51b, the DIW supplied from each of nozzles 41a, 51b was diffused on the surface of rotating wafer W, and an interflow area where DIW of both sides interflow with each other was formed.

Figure 16:
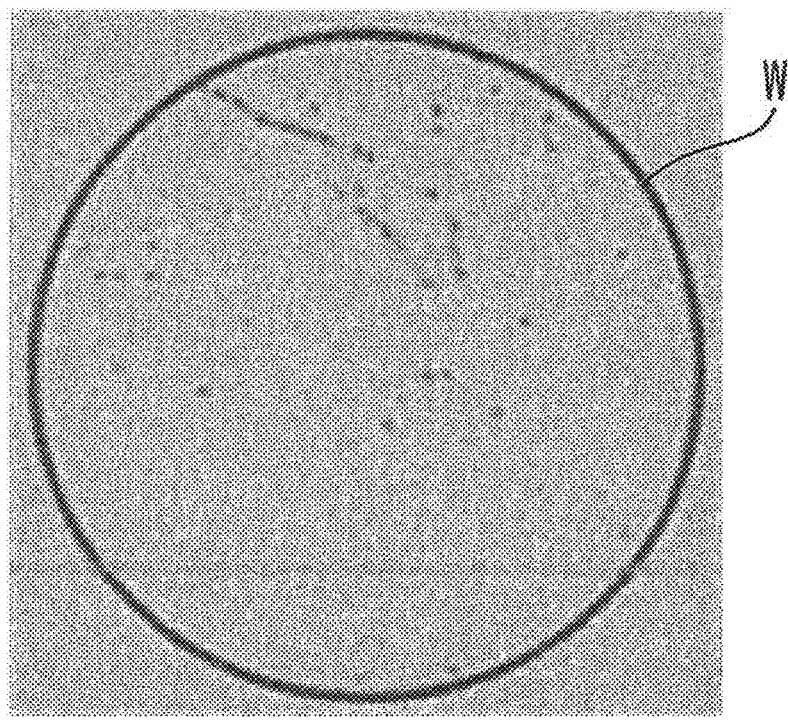
FIG. 16 is an explanatory view illustrating a distribution of particles on the surface of a wafer when a rinsing is performed using the first and second nozzles according to the reference example.

The interflow area was formed substantially in an S shape across wafer W along the rotating direction of wafer W. In the interflow area, a bubble inclusion phenomenon was observed which entrains a surrounding gas and produces bubbles B (FIG. 14). In addition, as a result of observing the distribution of particles on the surface of wafer after rinsing, particles were observed that are distributed while forming a track flowing in the direction opposite to the rotating direction of wafer W as illustrated in FIG. 16. It is estimated that this may have been caused since the bubbles B produced in the DIW interflow area produced particles on the surface of wafer W while flowing toward the outer periphery of wafer W.

Meanwhile, as illustrated in FIG. 11, when DIW was supplied to be concentrated to the central area of wafer W, such a distribution of particles was not confirmed and the number of particles was small. However, as illustrated in FIG. 14, even when first and second nozzles 41b, 51b are installed in such a manner that DIW does not intersect on the surface of wafer W, nozzle 41b that supplies an acidic chemical liquid and nozzle 51b that supplies an alkaline chemical liquid may be separated from each other such that the exchange of nozzles 41b, 51b and the switching of processing liquids may be performed according to the methods as exemplified in FIGS. 5 to 10. In such a case, an effect of reducing the cross contamination may surely be obtained as compared to a case where the acidic chemical liquid and the alkaline chemical liquid are supplied from a common nozzle.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
a first processing liquid supply unit including a first nozzle block provided with a first nozzle configured to selectively supply an acidic chemical liquid and a rinse liquid with a first switching operation to a substrate horizontally held and being rotated, and a first moving mechanism configured to move the first nozzle block between a first processing position above the substrate and a first retreat position next to the substrate;
a second processing liquid supply unit including a second nozzle block provided with a second nozzle configured to selectively supply an alkaline chemical liquid and the rinse liquid with a second switching operation to the substrate, and a second moving mechanism configured to move the second nozzle block between a second processing position above the substrate and a second retreat position next to the substrate; and
a control unit programmed to output a control signal to set the second nozzle to the second retreat position when the acidic chemical liquid is supplied to the substrate from the first nozzle, initiate to move the second nozzle to the second processing position when the first nozzle stops supplying the acidic chemical liquid to begin supplying the rinse liquid to the substrate, and to retreat the first nozzle to the first retreat position a processing position when the second nozzle is supplying the alkaline chemical liquid to the substrate,
wherein each of the first nozzle and the second nozzle is configured such that the respective chemical liquid arrives at a same position on a surface of the substrate when the respective chemical liquid is ejected from each of the first nozzle and the second nozzle.

2. The liquid processing apparatus of claim 1, wherein the control unit outputs a control signal to initiate supplying of the rinse liquid from the second nozzle at the second processing position when the rinse liquid is supplied from the first nozzle at the first processing position such that the rinse liquid is ejected to the same position concurrently from the first nozzle and the second nozzle.

3. The liquid processing apparatus of claim 2, wherein the control unit outputs a control signal to initiate retreating of the first nozzle when the second nozzle is supplying the rinse liquid to the substrate.

4. The liquid processing apparatus of claim 1, wherein the control unit outputs a control signal to initiate supplying of the alkaline chemical liquid from the second nozzle at the second processing position within a predetermined time before the surface of the substrate is exposed after supplying of the rinse liquid is stopped from the first nozzle so that is not covered by the rinse liquid.

5. The liquid processing apparatus of claim 3, wherein the control unit outputs a control signal to stop supplying the rinse liquid from one of the first nozzle and the second nozzle after both of the first nozzle and the second nozzle concurrently supply the rinse liquid.

6. The liquid processing apparatus of claim 2, wherein each of the first nozzle and the second nozzle is configured to have an ejection direction set to supply the respective chemical liquid from an inclined upper side toward the substrate held horizontally, and an inclined angle of each of the first nozzle and the second nozzle is set such that the respective chemical liquid arrives at a rotational center of the substrate.

7. The liquid processing apparatus of claim 1, wherein the first nozzle is configured to supply a drying liquid to the substrate while the rinse liquid is dried.

8. The liquid processing apparatus of claim 1, wherein the second nozzle is configured to initiate supplying the alkaline chemical liquid to the substrate after the first nozzle is retreated to the first retreating position.

9. A liquid processing apparatus comprising:
a first processing liquid supply unit including a first nozzle block provided with a first nozzle configured to selectively supply an acidic chemical liquid and a rinse liquid with a switching operation to a substrate horizontally held and being rotated, and a first moving mechanism configured to move the first nozzle block between a first processing position above the substrate and a first retreat position next to the substrate;
a second processing liquid supply unit including a second nozzle block provided with a second nozzle configured to selectively supply an alkaline chemical liquid and the rinse liquid with a switching operation to the substrate, and a second moving mechanism configured to move the second nozzle block between a second processing position above the substrate and a second retreat position next to the substrate; and
a control unit programmed to output a control signal to set the first nozzle to the first retreat position when the alkaline chemical liquid is supplied to the substrate from the second nozzle, initiates to move the first nozzle to the first processing position when the second nozzle stops supplying the alkaline chemical liquid to begin supplying the rinse liquid to the substrate, and to retreat the second nozzle to the second retreat position when the first nozzle is supplying the acidic chemical liquid to the substrate,
wherein each of the first nozzle and the second nozzle is configured such that the processing liquid arrives at a same position on a surface of the substrate when the respective chemical liquid is ejected from each of the first nozzle and the second nozzle.

10. The liquid processing apparatus of claim 9, wherein the control unit outputs a control signal to initiate supplying of the rinse liquid from the first nozzle at the first processing position when the rinse liquid is supplied from the second nozzle such that the rinse liquid is ejected to the same position concurrently from the first nozzle and the second nozzle.

11. The liquid processing apparatus of claim 9, wherein the control unit outputs a control signal to initiate retreating of the second nozzle when the first nozzle is supplying the rinse liquid to the substrate.

12. The liquid processing apparatus of claim 9, wherein the control unit outputs a control signal to initiate supplying of the acidic chemical liquid from the first nozzle at the first processing position within a predetermined time before the surface of the substrate is exposed after supplying of the rinse liquid is stopped from the second nozzle so that is not covered by the rinse liquid.

13. The liquid processing apparatus of claim 9, wherein the second nozzle is configured to supply a drying liquid to the substrate while the rinse liquid is dried.

14. The liquid processing apparatus of claim 9, wherein the first nozzle is configured to initiate supplying the acidic chemical liquid to the substrate after the second nozzle is retreated to the second retreating position.

15. The liquid processing apparatus of claim 9, wherein each of the first nozzle and the second nozzle is configured to have an ejection direction set to supply the respective chemical liquid from an inclined upper side toward the substrate held horizontally, and an inclined angle of each of the first nozzle and the second nozzle is set such that the respective chemical liquid arrives at a rotational center of the substrate.

\* \* \* \* \*